United States Patent [19]

Mark

[11] 3,964,986
[45] June 22, 1976

[54] METHOD OF FORMING AN OVERLAYER INCLUDING A BLOCKING CONTACT FOR CADMIUM SELENIDE PHOTOCONDUCTIVE IMAGING BODIES

[75] Inventor: Gordon Mark, Princeton, N.J.
[73] Assignee: RCA Corporation, New York, N.Y.
[22] Filed: Mar. 31, 1975
[21] Appl. No.: 563,815

[52] U.S. Cl. ................... 204/192; 313/94; 427/76
[51] Int. Cl.² ............... C23C 15/00; H01J 39/00
[58] Field of Search .......... 204/192; 427/76, 35, 427/38, 39

[56] References Cited
UNITED STATES PATENTS

| 3,355,371 | 11/1967 | Hile et al. | 204/164 |
| 3,736,242 | 5/1973 | Schwartz et al. | 204/192 |
| 3,761,375 | 9/1973 | Pierce et al. | 204/192 |
| 3,829,372 | 8/1974 | Heller | 204/192 |
| 3,830,717 | 8/1974 | Singer et al. | 204/192 |
| 3,869,368 | 3/1975 | Beardmore et al. | 204/192 |

Primary Examiner—John H. Mack
Assistant Examiner—Aaron Weisstuch
Attorney, Agent, or Firm—Glenn H. Bruestle; Robert J. Boivin

[57] ABSTRACT

A major surface of a cadmium selenide body is exposed within a reactive sputtering apparatus to controlled bombardment with electrons, and to controlled simultaneous reactive sputter deposition of an overlayer including aluminum and oxygen.

9 Claims, 4 Drawing Figures

METHOD OF FORMING AN OVERLAYER INCLUDING A BLOCKING CONTACT FOR CADMIUM SELENIDE PHOTOCONDUCTIVE IMAGING BODIES

BACKGROUND OF THE INVENTION

This invention relates to cadmium selenide photoconductive imaging devices and more particularly to photoconductive imaging devices employing cadmium selenide bodies which include a blocking contact, or heterojunction, similar in electrical characteristics to a p-n junction.

Cadmium selenide bodies are known which display high photosensitivities when employed in photoconductive light sensitive imaging devices. This and other advantages makes such cadmium selenide bodies particularly desirable for use in devices such as camera tubes or as coatings for electrophotographic plates. Unfortunately, unstable and/or high dark currents normally associated with such prior art photoconductive bodies, have precluded their general commercialization in light sensitive devices.

Recently, researchers in the field of cadmium selenide photoconductors have sought to improve the dark current characteristics associated with cadmium selenide bodies by incorporating an overlayer of cadmium salt of oxy-acid on a base layer of cadmium selenide by somewhat complicated processing methods. The purpose of this overlayer is to stabilize and reduce the dark current by forming a blocking contact to electrons within the body whereby the body may be depleted in a manner analogous to a p-n junction. Such a photoconductor body is, for example, described in U.S. Pat. No. 3,816,787, issued to K. Shimizu et al on June 11, 1974. Alternative cadmium selenide bodies having low and stable dark current characteristics are, however, desired wherein less complicated methods may be employed for their manufacture.

SUMMARY OF THE INVENTION

An overlayer is formed along a surface portion of a cadmium selenide photoconductive body by exposing a deposition surface portion of the body to bombardment with electrons, in a partial pressure of oxygen while simultaneously subjecting the deposition surface portion to vapors of aluminum, or oxygen compounds thereof, to cause deposition of aluminum and oxygen along that deposition surface portion. The process is extended an effective period of time to form a blocking contact within the body.

DESCRIPTION OF THE PREFERRED EMBODIMENTS

The Apparatus and Product

Figure 1:
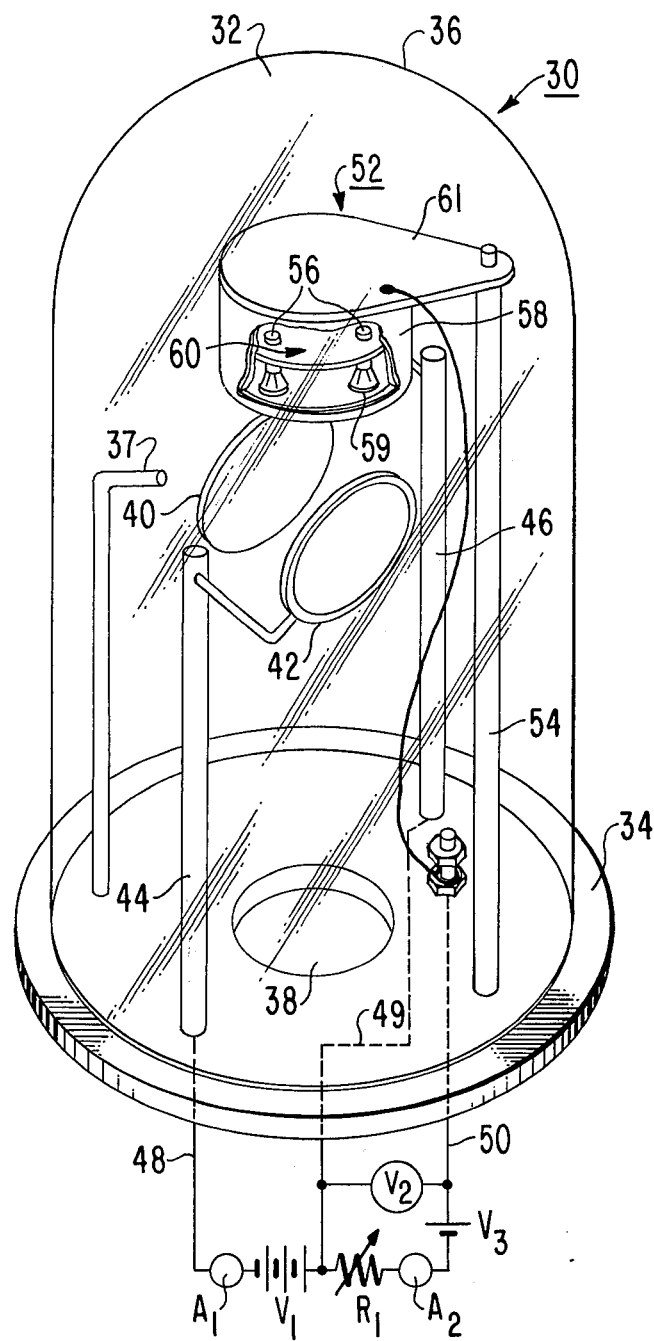
FIG. 1 is a simplified drawing of a reactive sputtering apparatus for exposing cadmium selenide photoconductive bodies to electron bombardment and for sputter depositing an overlayer in accordance with the invention.

FIG. 1 depicts a reactive sputtering apparatus 30 whereby an overlayer may be reactively sputtered on exposed cadmium selenide surface portions of a plurality of workpieces 59 in accordance with the invention.

The apparatus 30 includes a cylindrically-shaped dome-like vacuum chamber 32 enclosed by a base plate 34 and a bell jar 36. The chamber 32 is preferably approximately 45 cm. long and approximately 31 cm. in diameter.

A tubular oxygen inlet 37 is provided into the vacuum chamber 32 and includes a passageway extending from the interior to the exterior of the apparatus 30 for introducing oxygen within the chamber 32. An exhaust port 38 extends through the baseplate 34 and is interconnected by means of a tubulation (not shown) to an evacuation system suitable for evacuating the chamber 32 to a pressure level of less than $10^{-4}$ torr. in a manner well known in the art. A platinum plate anode electrode 40 is vertically mounted within the chamber 32 in substantially parallel spaced relation from an aluminum ring cathode electrode 42 by means of various vertical support posts 46 and 44, respectively, to which they are secured. The electrodes 40 and 42 are preferably disc-shaped (i.e. substantially circular) and spaced-apart a distance of approximately 12 cm. However, distances of separation of electrodes 40 and 42 of from approximately 2.5 cm. to approximately 18 cm. may be employed to advantage. The disc-shaped electrodes 40 and 42 are preferably approximately 7.6 cm. in diameter. The aluminum ring electrode 42, for example, may be fabricated from aluminum wire having a diameter of approximately 3 mm.

A workpiece holder 52 is fixably mounted in a horizontal plane above and perpendicular to the vertical planes along which the respective electrodes 40 and 42 are positioned. The workpiece holder 52 comprises an aluminum enclosure including a hollowed bottom or cup-like portion 58. The exterior surface of the aluminum cup-like portion 58 is preferably electrolytically-anodized to form along that surface a suitable thickness of electrically insulating material. In the preferred form of the apparatus 30, the workpiece holder 52 may be disassembled to expose within the interior of the cup-like portion 58, a plurality of spring loading workpiece holder members 56 for securing and retaining a plurality of workpieces 59 as hereinafter disclosed.

Electrical leads 48, 49 and 50 are electrically interconnected to each of the electrodes 42, 40 and the holder members 56, respectively, and extend through the baseplate 34 external to the chamber 32 for connection to suitable sources of electrical potential $V_1$ and $V_3$ as hereinafter described.

The apparatus 30 may be employed for providing controlled electron bombardment of the deposition surfaces of each of the workpieces 59 while simultaneously reactively sputter depositing an overlayer of a controlled thickness on a base layer of cadmium selenide, as hereinafter described. Cadmium selenide bodies fabricated with the apparatus 30 have been found to possess excellent sensitivity characteristics when employed in photoconductive imaging devices such as, for example, camera tubes.

Figure 2:
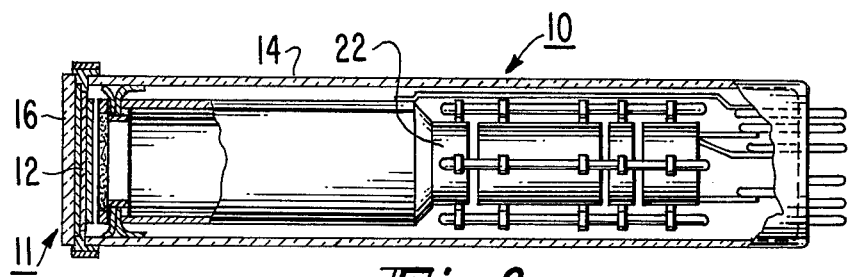
FIG. 2 is a cross-sectional view of a vidicon-type camera tube incorporating a photoconductive body fabricated in part, in accordance with the invention.
Figure 3:
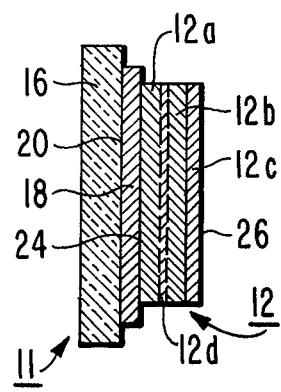
FIG. 3 is a greatly exaggerated cross-sectional view of the target of the tube depicted in FIG. 2.

A vidicon-type camera tube 10 is, for example, depicted in FIG. 2. In the tube 10, a light sensitive target 11 is mounted at one end of an evacuated envelope 14. Referring to FIGS. 2 and 3, the target 11 includes a photoconductive body 12 which is scanned by an electron beam forming and scanning means 22 in a manner well known in the art. The target 11 also includes a transparent glass faceplate 16 having a major surface 20 with a transparent conductive coating 18 thereon. The photoconductive body 12 is fabricated on the available major surface of the coating 18.

In a preferred embodiment, the photoconductive body 12, comprises in a direction of thickness progressing from one of its major surfaces 24, in contact with the coating 18, to another opposed major surface 26 which is scanned by the electron beam: (1) a first material region 12a substantially of polycrystalline n-type electrical conductivity cadmium selenide; (2) a second material region 12b or insulating overlayer substantially of aluminum oxide; and (3) a third material region 12c consisting of a high resistance compound with a resistivity equal to or exceeding about $10^8$ ohm-cm. A transition region 12d is provided at the interface between the first and second material regions 12a and 12b and comprises a thin graded transition of the materials and/or individual elements of the neighboring first and second regions.

A semiconductor-insulator blocking contact is within a portion of the photoconductor 12 which consists of the transition region 12d and the overlayer 12b. The "blocking contact" as herein defined constitutes a portion of the photoconductive body 12 having a considerably decreased concentration of majority carriers relative to the majority carrier concentration associated with the first material region 12a, whereby non-photogenerated majority carriers (electrons from the electron beam) in the second material region 12b are substantially blocked or prevented from entering or being conducted into the first material region 12a of the photoconductive body, and whereby photogenerated minority carriers within the first material region 12a may be effectively conducted to combine with the non-photogenerated majority carriers within the second material region 12b.

THE METHOD

In preferred embodiments, the photoconductive body 12 is fabricated or formed on a prefabricated workpiece 59 including the faceplate 16 and the transparent conductive coating 18. The transparent conductive coating 18 may, for example, comprise a tin oxide material, $SnO_2$, which is predeposited on the faceplate 16 by techniques well known in the art. Prior to the fabrication of the regions 12b and 12d of the photoconductive body 12, as hereinafter described, a base layer of cadmium selenide 12a is, for example, vapor deposited in a vacuum on the available major surface of the transparent coating of each workpiece 59.

In the method, a plurality of workpieces 59 are positioned within the interior of the cup-like portion 58 of the apparatus 30 (FIG. 1), substantially in aligned relation with a plurality of mask-like through-openings, or apertures (not shown) extending through the bottom of the cup-like portion 58. In this manner an un-masked surface portion (hereinafter "exposed surface") of each of the workpieces 59 is exposed, external to the holder 52, within the chamber 32. Thereafter, the workpiece holder members 56 of a spring assembly 60 are positioned within the cup-like portion 58 to secure the workpieces 59 and to make electrical contact to the conductive coating 18 of each of the workpieces 59. Thereafter, a top plate 61 is secured to the top of the cup-like portion 58. The workpiece holder 52 is positioned within the chamber 32 by means of a support post 54 such that the "exposed" surface of each of the workpieces 59 is located in a horizontal plane substantially perpendicular to the vertical planes within which the parallel electrode members 40 and 42 are located. In the preferred embodiment of the apparatus 30, the workpiece holder 52 is positioned directly above, and centrally between, the electrode 40 and 42 as shown in FIG. 1.

The unmasked surfaces of the workpieces 59 which are exposed through the apertures of cup-like portions 58 are positioned along a plane which is parallel to a central axis passing through the disc-like platinum plate 40 and aluminum ring 42 and displaced therefrom by a perpendicular distance of from approximately 7.5 cm. to approximately 20 cm; however, the preferable distance is approximately 12 cm.

The bell jar 36 is thereafter placed in registry with the base member 34 to form therewith a vacuum seal (not shown). The chamber 32 is then evacuated in a manner well known in the art to a pressure level of preferably less than $10^{-4}$ torr. A direct current voltage of from about 600 to about 1500 volts D.C. is then applied via leads 49 and 48 to the anode and cathode electrodes 40 and 42, respectively, from the output terminals of voltage source $V_1$. The voltage source $V_1$ preferably is about 800 volts. Thereafter, oxygen is introduced through the inlet 37 until a suitable plasma current (i.e. the current measured through ammeter $A_1$) is established. In general, pressures of oxygen within the range of from about 0.1 to 0.5 torr. have been found to be particularly desirable for the preferred embodiments. A plasma cloud or glow discharge field region composed of ions of oxygen is created between electrodes 40 and 42, and about their peripheral edges. During glow discharge atoms of aluminum are dislodged from the aluminum ring 42 and are dispersed throughout the chamber 32 as vapors of aluminum, or oxides thereof.

During the period of time within which the glow discharge field is formed within chamber 32, a variable voltage is also applied via leads 49 and 50 between the anode electrode 40 and the conductive coating 18 of each of the workpieces 59 as measured on voltmeter $V_2$. Electrons which are released during glow discharge are accelerated to substantially uniformly impinge upon or bombard each of the exposed, or unmasked surface portions of the workpieces 59.

The variable voltage applied between anode electrode 40 and workpieces 59 may be generated, as shown in FIG. 1, by means of a D.C. voltage source $V_3$ in series with a variable resistor $R_1$. The voltage of the source $V_3$ preferably is approximately 25 volts; however, voltages of from about 5 V.D.C. to about 50 V.D.C. may be employed to advantage. The resistance of $R_1$ is selected to provide effective control of the current between the cathode electrode 42 and workpieces 59 as measured on ammeter $A_2$. The current through ammeter $A_2$ is preferably controlled at an effective level whereby the respective exposed surfaces of the workpieces are sufficiently bombarded by the electrons to provide a controlled activation and/or conditioning of each of those surfaces as hereinafter described. Atoms of aluminum and oxygen, or aluminum oxide molecules, are continually deposited along a deposition surface portion (i.e. the unmasked surface portions) of each workpiece 59 to a controlled depth related to the length of time of the sputtering exposure period (hereinafter "exposure period"). The average rate at which the transition region 12d and second material region 12b are formed preferably is on the order of less than about 300A per hour; however, average rates approaching about 1000A per hour may be employed to advantage. Rates of formation of about 100A per hour are thought to be particularly effective.

It is believed that the controlled electron bombardment of the exposed deposition surface portions of the workpieces 59 "reactively" conditions those surfaces by, for example, cleaning and/or removing undesirable surface oxides, or other surface contaminants, and also may provide a controlled heating/or other activation of those surfaces, or the aluminum and oxygen deposited thereon, essential to the fabrication of the blocking contact previously described. Furthermore, a controlled interdiffusion by heating, or other phenomena, of the material or elements at the region of the interface between the cadmium selenide region 12a and the sputter deposited overlayer of aluminum and oxygen occurs whereby the transition material region 12d is fabricated. If the exposure period is continued for a sufficient length of time, a region 12b substantially of aluminum oxide is fabricated over the transition region 12d. It is believed that the electrical conductivity of the cadmium selenide material along the surface region proximate to, or abutting the sputter deposited overlayer is modified or conditioned from material of substantially n-type electrical conductivity having excessive majority carrier concentration to a material which is more intrinsic, when selenium vacancies along that region are filled or occupied by oxygen.

In a preferred method, the workpieces 59 are exposed to reactive sputter deposition within the apparatus 30, as described above, for a period of time in excess of ½ hour. Time periods of exposure from about 1½ hours to about 3 hours have been shown to be particularly desirable; however, other periods of exposure may be employed to advantage so long as an adequate blocking contact is fabricated within the resulting photoconductive body.

During the exposure period, a substantially constant plasma current (i.e. the current through ammeter "$A_1$", FIG. 1) of about 56 milliamperes is preferably maintained, however, the level of that current may be varied to advantage dependng upon the size and configuration of the anode and cathode electrodes 40 and 42 and the level of electron emission desired from the cathode electrode 42. The current through ammeter $A_1$ should exceed 45 mA. for the preferred embodiment of the apparatus 30. The desired current level may be expeditiously achieved by varying the partial pressure of oxygen within the chamber 32 (i.e. by adjusting the rate of introduction of oxygen through inlet 37) to that necessary to achieve the current through ammeter $A_1$ desired, and thereafter maintaining the established partial pressure of oxygen corresponding thereto.

Figure 4:
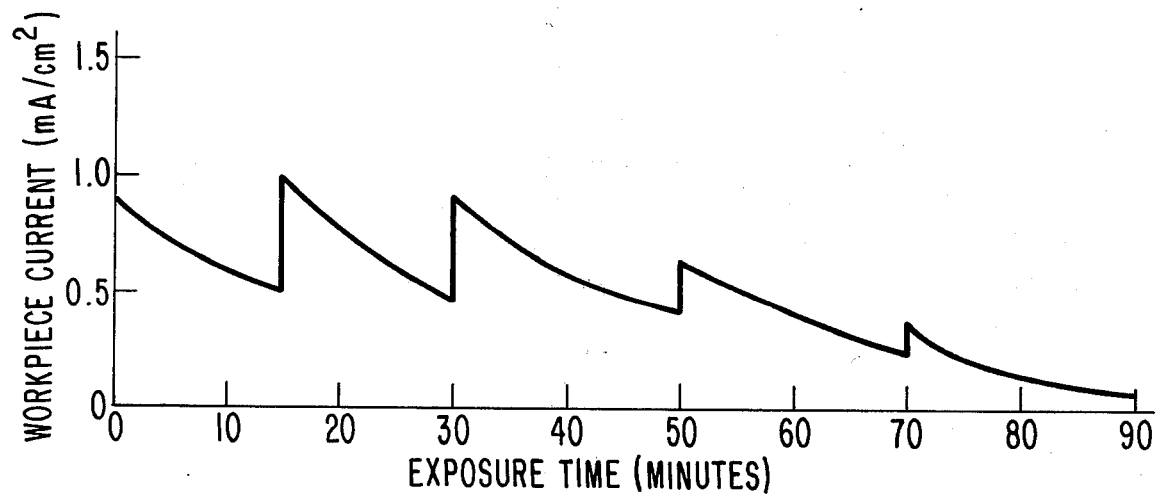
FIG. 4 is a graph showing a preferred substantially stable workpiece current profile for the apparatus of FIG. 1 over an exposure period of 90 minutes in accordance with the invention.

During the exposure period, a substantially stable workpiece current (i.e. current through ammeter $A_2$) is established between each of the workpieces 59 and the electrodes 40 and 42. The workpiece current preferably is maintained at a substantially stable level, or average value, per unit of exposed deposition surface area of the workpieces 59, less than about 1 milliampere per cm.$^2$; however, average current levels up to about 4 mA./cm.$^2$ may be employed to advantage. In general, the current range within which the workpiece current is stabilized (i.e., the range within the fluctuations of that current are contained) may be varied to advantage below about 8 mA./cm$^2$ so long as there exists adequate electron bombardment of the deposition surface portions of the respective workpieces 59 during the exposure period to provide the activation and/or conditioning necessary for the formation of the blocking contact as previously described. It is particularly necessary to avoid current levels for the workpiece current which cause the exposed surfaces of the workpieces 59 to be removed by the sputtering process. During the exposure period of the workpieces 59 to electron bombardment and sputter deposition, the variable resistor $R_1$, in series with the D.C. voltage source $V_3$, is decreased in value as necessary to substantially stabilize the workpiece current at the desired level. Referring to FIG. 4, there is shown in graphical form one example of a preferred and substantially stable workpiece current profile in milliamperes per cm.$^2$ of exposed deposition surface area of the workpiece 59 over an exposure period of 90 minutes, wherein D.C. voltage source of $V_3=25$ volts was employed.

Subsequent to the exposure of the workpieces 59 within the apparatus 30 for a suitable period of time, the resulting targets 11 are removed from the apparatus 30, and a third material region 12c is deposited as an additional overlayer on top of the material region 12b. This third material region 12c may consist of a high resistance chalcogenide compound having a resistivity exceeding $10^8$ ohm -cm. The third material region 12c may be vacuum deposited in a manner well known in the art.

By means of the above-described reactive sputter deposition method, a blocking contact displaying characteristics similar to a p-n junction, may be relatively quickly and easily fabricated along exposed cadmium selenide surface portions of respective ones of a plurality of workpieces 59.

While the fabrication of a target for a vidicon-type camera tube is described in detail, the method and apparatus herein described may be generally employed for forming an effective blocking contact along surfaces of light sensitive cadmium selenide photoconductive imaging bodies. For example, persons of ordinary skill in the art could employ the method herein described to fabricate an electrophotographic plate.

What I claim is:

1. A method of forming a transition material region along a surface portion of a first material region of a photoconductive imaging body wherein the material composition of the transition material region comprises a graded atomic transition of the material of the first material region with increasing amounts of aluminum and oxygen in a direction proceeding away from the first material region, including the steps of:
   a. bombarding a deposition surface portion of the photoconductive body with electrons to achieve a current through said body of less than about 8 mA. per cm.$^2$ of surface area of said deposition surface portion in an atmosphere of oxygen at a pressure of from about 0.1 to about 0.5 torr, and simultaneously
   b. subjecting the deposition surface portion of the photoconductive body to vapors of aluminum, or oxygen compounds thereof, to cause deposition of aluminum and oxygen along said deposition surface portion to form said transition material region.

2. The method of claim 1, wherein the material of said first material region comprises cadmium selenide.

3. The method of claim 2, wherein said depositing and bombarding are continued for a period of time exceeding ½ hour.

4. The method of claim 3, wherein said depositing and bombarding are continued for a period of time from about 1½ to about 3 hours.

5. The method of claim 3, wherein said current through said body is substantially stabilized at an average value of less than about 4 mA. per cm.$^2$ of area of said deposition surface portion.

6. The method of claim 1, wherein said deposition surface portion is subjected to said vapors at an effective level whereby the average rate of formation of said transition material region is less than about 1000A per hour.

7. The method of claim 6, wherein the formation of said transition material region is at an average rate of less than about 300A per hour.

8. The method of claim 7, wherein the formation of said transition material region is at an average rate of about 100A per hour.

9. The method of claim 6, wherein steps (a) and (b) are continued after the formation of said transition material region for an effective period of time whereby a region substantially of aluminum oxide is formed over said transition material region.

* * * * *